(12) United States Patent
Kim

(10) Patent No.: US 7,276,412 B2
(45) Date of Patent: Oct. 2, 2007

(54) MIM CAPACITOR OF SEMICONDUCTOR DEVICE AND MANUFACTURING METHOD THEREOF

(75) Inventor: Min Seok Kim, Shihueng-shi (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/319,533

(22) Filed: Dec. 29, 2005

(65) Prior Publication Data

US 2006/0138593 A1    Jun. 29, 2006

(30) Foreign Application Priority Data

Dec. 29, 2004    (KR) .................. 10-2004-0115677

(51) Int. Cl.
*H01L 21/8242*    (2006.01)

(52) U.S. Cl. .................. 438/255; 438/142; 438/197; 438/238; 438/239; 438/253; 257/288; 257/213; 257/296; 257/306; 257/309; 257/E21.012

(58) Field of Classification Search .................. None
See application file for complete search history.

(56) References Cited

U.S. PATENT DOCUMENTS

| 5,407,534 | A | * | 4/1995 | Thakur | .................. | 438/398 |
| 5,696,017 | A | * | 12/1997 | Ueno | .................. | 438/253 |
| 6,251,726 | B1 | * | 6/2001 | Huang | .................. | 438/253 |

* cited by examiner

*Primary Examiner*—Leonardo Andujar
*Assistant Examiner*—Kevin Quinto
(74) *Attorney, Agent, or Firm*—Finnegan, Henderson, Farabow, Garrett & Dunner, L.L.P.

(57) ABSTRACT

In a capacitor of a semiconductor device, a bottom electrode is formed on a substrate and has an uneven top surface. An interlayer insulation layer is formed on the substrate and has a via hole exposing the top surface of the bottom electrode. A dielectric layer is formed unevenly on the bottom electrode. A top electrode is formed on the dielectric layer while filling the via hole.

19 Claims, 4 Drawing Sheets

MIM CAPACITOR OF SEMICONDUCTOR DEVICE AND MANUFACTURING METHOD THEREOF

BACKGROUND OF THE INVENTION

1. Field of the Invention

The present invention relates to a capacitor of a semiconductor device, and more particularly, to a metal insulator metal (MIM) capacitor of a semiconductor device and a manufacturing method thereof.

2. Description of the Related Art

Generally, a capacitor is constructed with a bottom electrode, a dielectric layer, and a top electrode. The dielectric layer serves as an insulation layer. The capacitor stores data through charge accumulation. Capacitors are classified into a metal insulator metal (MIM) capacitor, a metal insulator silicon (MIS) capacitor, and a polysilicon insulator polysilicon (PIP) capacitor, depending on their structures.

A related art MIM capacitor will be described below with reference to FIG. 1.

Referring to FIG. 1, the related art MIM capacitor includes a bottom electrode 21 formed on a substrate 10, a dielectric layer 40 formed on the bottom electrode 21, and a top electrode 51 and 61 formed on the dielectric layer 40. Accordingly, the capacitor has an MIM structure. The top electrode may include a conductive plug 51 and a conductive layer 61.

Also, the related art MIM capacitor is formed together with a metal interconnection because it has to be simultaneously implemented with other semiconductor devices.

For this reason, a bottom interconnection 22 is formed on the substrate 10 together with the bottom electrode 21. After an interlayer insulation layer 30 is formed on the substrate 10, a via plug 52 is formed together with the conductive plug 51. Then, a top interconnection 62 is formed together with the conductive layer 61.

As the semiconductor device is integrated more highly and miniaturized, an area of a memory cell is getting smaller. However, a unit area of the capacitor cannot be reduced in proportion to the area reduction of the memory cell. This is because electric capacity per unit memory cell is required to have more than a predetermined value so as to maintain a stable operation of the semiconductor device.

Many attempts have been made to maintain the capacitor capacity to more than an appropriate value within a restricted memory cell area. Examples of these studies are a method of reducing a thickness of a dielectric layer, a method using material with high dielectric constant, a method of increasing an effective surface area of a capacitor, and so on.

However, the size of the memory cell is reduced with the high integration of the semiconductor device and thus the effective surface area of the capacitor is also reduced. Consequently, the related art has a problem in that an appropriate electric capacity cannot be obtained.

Also, there is a limitation in miniaturization of the semiconductor device because the size of the memory cell cannot be reduced for the purpose of the appropriate electric capacity of the capacitor.

SUMMARY OF THE INVENTION

Accordingly, the present invention is directed to a capacitor of a semiconductor device and a manufacturing method thereof that substantially obviate one or more problems due to limitations and disadvantages of the related art.

An object of the present invention is to provide a capacitor of a semiconductor device and a manufacturing method thereof, capable of obtaining a high electric capacity in a capacitor of a memory cell, in the same size, by increasing an effective surface area of the capacitor without expanding the size of the memory cell. Therefore, the present invention can attribute to high integration and ultra-miniaturization of the semiconductor device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a capacitor of a semiconductor device, including: a bottom electrode formed on a substrate, the bottom electrode having an uneven top surface; an interlayer insulation layer formed on the substrate, the interlayer insulation layer having a via hole exposing the top surface of the bottom electrode; a dielectric layer formed unevenly on the bottom electrode; and a top electrode formed on the dielectric layer while filling the via hole.

In another aspect of the present invention, a method of manufacturing a capacitor of a semiconductor device, including: forming a first conductive layer on a substrate; selectively etching the first conductive layer to form a first interconnection and a bottom electrode with an uneven top surface; forming an interlayer insulation layer on the substrate where the first interconnection and the bottom electrode are formed; selectively etching the interlayer insulation layer to form a first via hole exposing a surface of the bottom electrode, and forming a dielectric layer on the bottom electrode; selectively etching the interlayer insulation layer to form a second via hole exposing a top surface of the first interconnection, and forming a conductive plug and a via plug in the first via hole and the second via hole, respectively; forming a second conductive layer on the interlayer insulation layer wherein the conductive plug and the via plug are formed; and selectively etching the second conductive layer to form a second interconnection connecting to the via plug and a conductive layer connecting to the conductive plug.

In a further another aspect of the present invention, there is provided a method of manufacturing a capacitor of a semiconductor device, including: forming a first conductive layer on a substrate; patterning and etching the first conductive layer to form a first interconnection and a bottom electrode; forming an interlayer insulation layer on the substrate where the first interconnection and the bottom electrode are formed; etching the interlayer insulation layer to form a first via hole exposing a predetermined portion of a surface of the bottom electrode; forming unevenness on a top surface of the bottom electrode; forming a dielectric layer on the bottom electrode; selectively etching the interlayer insulation layer to form a second via hole exposing a top surface of the first interconnection, and forming a conductive plug and a via plug in the first via hole and the second via hole, respectively; forming a second conductive layer on the interlayer insulation layer where the conductive plug and the via plug are formed; and selectively etching the second conductive layer to form a second interconnection connecting to the via hole and a conductive layer connecting to the conductive plug.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a capacitor of a semiconductor device and a manufacturing method thereof according to the present invention will be described in detail with reference to the accompanying drawings.

EMBODIMENT 1

Figure 1:
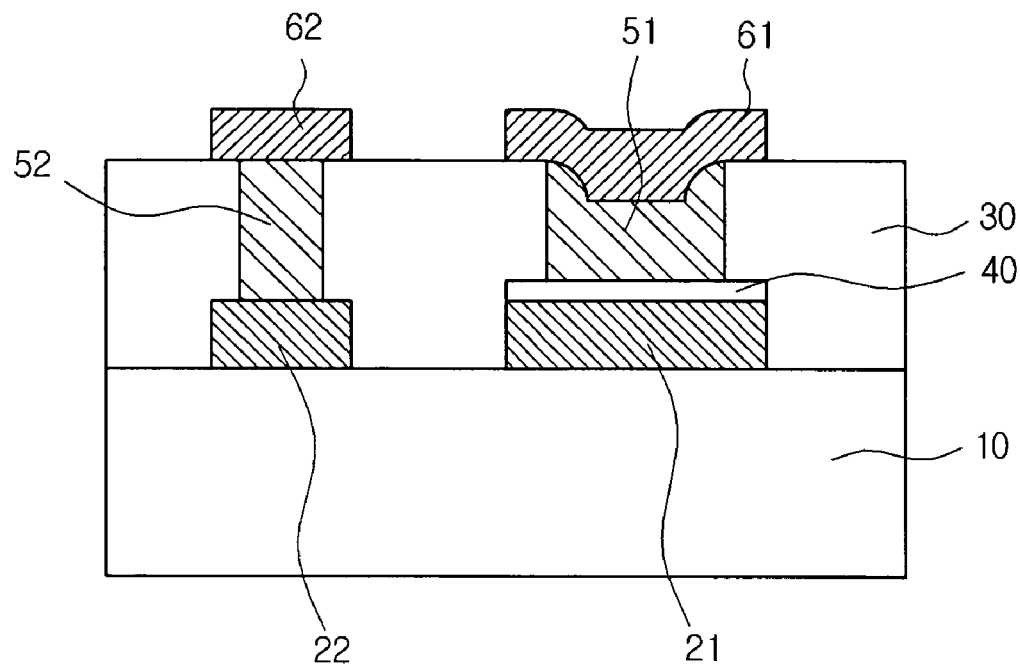
FIG. 1 is a sectional view of a related art capacitor of a semiconductor device.
Figure 2:
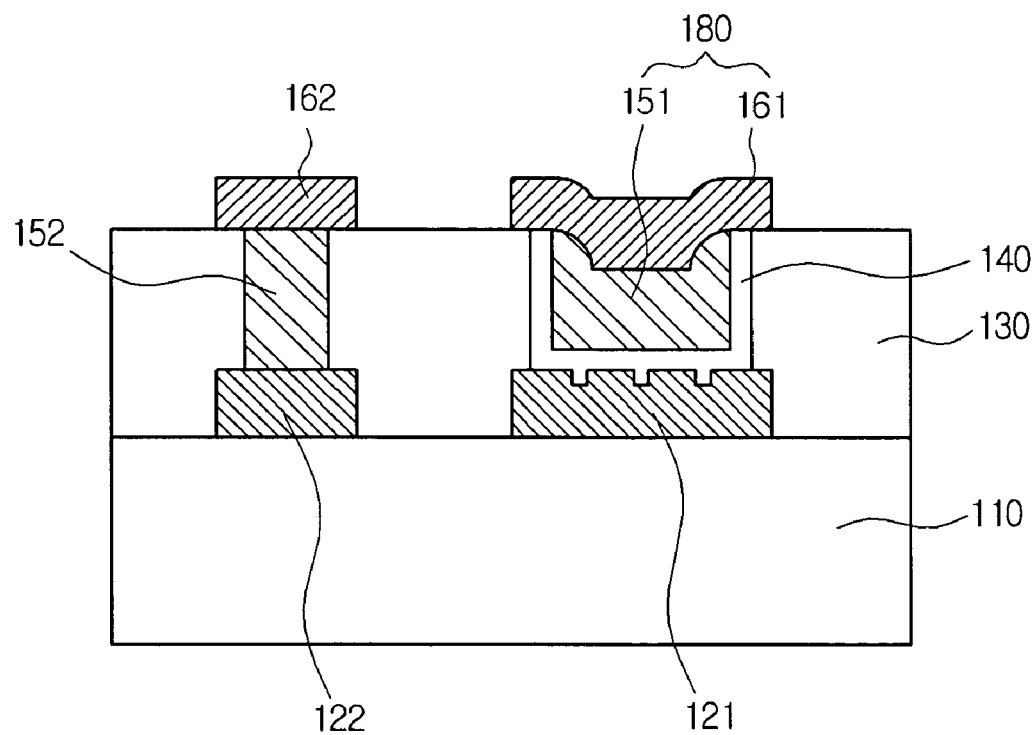
FIG. 2 is a sectional view of a capacitor of a semiconductor device according to an embodiment of the present invention.

FIG. 2 is a sectional view of a capacitor of a semiconductor device according to a first embodiment of the present invention.

Referring to FIG. 2, the capacitor of the semiconductor device includes a bottom electrode 121, an interlayer insulation layer 130, a dielectric layer 140, and a top electrode 180, which are sequentially formed on a substrate 110. The top electrode may include a conductive plug 151 and a conductive layer 161.

The bottom electrode 121 is formed on the substrate 110 and has an uneven top surface. The unevenness of the bottom electrode 121 causes unevenness in the dielectric layer 140, which will be described later. Consequently, the effective surface area of the capacitor increases and thus the electric capacity of the capacitor increases.

The interlayer insulation layer 130 may be formed on the substrate 110 and have a via hole (not shown) exposing the top surface of the bottom electrode 121. The interlayer insulation layer 130 may be formed of chemical vapor deposition (CVD)-tetraethyl orthosilicate (TEOS), plasma enhanced chemical vapor deposition (PECVD)-$SiO_2$, PECVD-SiON, or borophospho silicate glass (BPSG) using TEOS. Of course, the interlayer insulation layer 130 may also be formed of other materials.

The dielectric layer 140 is unevenly formed on the bottom electrode 121. Also, the dielectric layer 140 may be formed on the top surface of the bottom electrode 121 and the interlayer insulation layer 130 disposed inside the via hole. Further, the unevenness of the dielectric layer 140 may be disposed in the lower side of the dielectric layer 140, or the lower and upper sides of the dielectric layer 140.

The dielectric layer 140 may be formed in a single-layered structure or a multi-layered structure. That is, the dielectric layer 140 may be formed of material selected from the group consisting of nitride, plasma tetraethyl orthosilicate (P-TEOS), plasma enhanced oxide (PEOX), plasma enhanced nitride (PESiN), high density plasma (HDP), $Ta_2O_5$, spin on glass (SOG), $O_3$-TEOS, BST(Ba, Sr)$TiO_3$), lead zirconium titanate (PZT), and a combination thereof.

As described above, the unevenness of the dielectric layer 140 increases the effective surface area of the capacitor, resulting in the increase of electric capacity of the capacitor.

The top electrode 180 may be formed on the electric layer 140, while filling the via hole. The top electrode 180 may be a stacked structure of the conductive plug 151 and the conductive layer 161. The conductive plug 151 may be formed of material selected from the group consisting of tungsten (W), aluminum (Al) alloy, and copper (Cu) alloy.

When the conductive plug 151 is formed of tungsten (W), a barrier metal layer (not shown) may be further formed inside the via hole. In this case, the barrier metal layer may be formed in a single-layered structure or a multi-layered structure. That is, the barrier metal layer may be formed of material selected from the group consisting of Ti, Ta, W, Mo, TiN, TiW, TaN, MoN, W—N, W—Si—N, Ta—Si—N, W—B—N, Ti—Si—N, and a combination thereof.

The conductive layer 161 may be formed of Al alloy or Cu alloy.

In this embodiment, a conductive plug (not shown) connecting to the bottom electrode 121 may be further formed below the bottom electrode 121 in the substrate 110.

Also, anti-reflection layers (not shown) may be further formed on the top surfaces of the bottom and top electrodes 121 and 180, respectively. The anti-reflection layer may be in a single-layered structure or a multi-layered structure. That is, the anti-reflection layer may be formed of material selected from the group consisting of Ti, Ta, W, Mo, TiN, TiW, TaN, MoN, W—N, W—Si—N, Ta—Si—N, Ta—Si—N, W—B—N, Ti—Si—N, a combination thereof.

In addition, barrier metal layers (not shown) may be further formed on the bottom surface of the bottom electrode 121, the bottom surface of the conductive layer 161, and the bottom surface of the conductive plug 151, respectively. In this case, the barrier metal layer may be formed in a single-layered structure or a multi-layered structure. That is, the barrier metal layer may be formed of material selected from the group consisting of Ti, Ta, W, Mo, TiN, TiW, TaN, MoN, W—N, W—Si—N, Ta—Si—N, Ta—Si—N, W—B—N, Ti—Si—N, and a combination thereof.

According to the present invention, by forming the bottom electrode with the uneven top surface, the dielectric layer is also formed unevenly. Consequently, the effective surface area of the capacitor increases and thus the electric capacity of the capacitor also increases.

Also, since the capacitor has high electric capacity in the same size, the capacitor can be implemented in a small size, thereby attributing to high integration and ultra-miniaturization of the semiconductor device.

A method of manufacturing the capacitor of the semiconductor device according to the first embodiment of the present invention will be described below in detail with reference to FIGS. 3 to 7.

The method of manufacturing the capacitor of the semiconductor device according to the first embodiment of the present invention includes forming a first conductive layer, forming a first interconnection and a bottom electrode, forming an interlayer insulation layer, forming a dielectric layer, forming a via plug and a conductive layer, forming a second conductive layer, and forming a second interconnection and a conductive layer for the top electrode.

Figure 3:
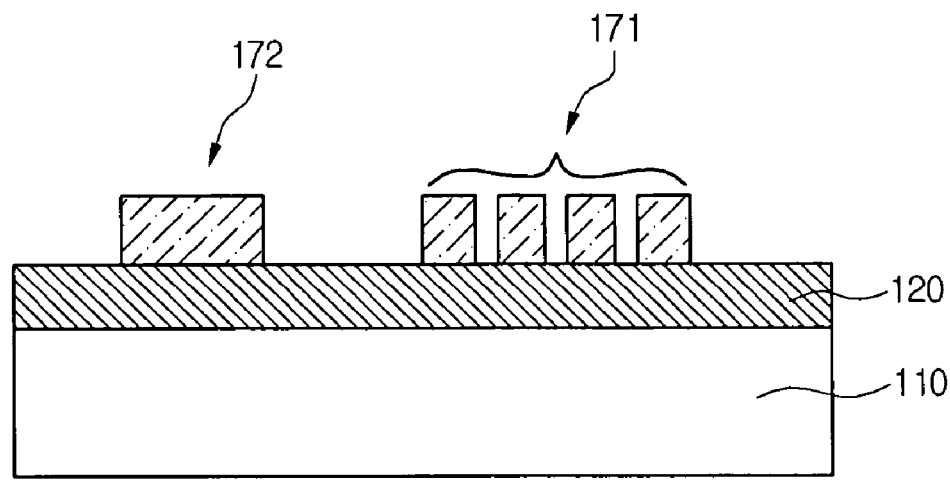
FIGS. 3 to 8 are sectional views illustrating a method of manufacturing the capacitor of the semiconductor memory according to the embodiment of the present invention.

First, referring to FIG. 3, a first conductive layer 120 is formed on a substrate 110. The first conductive layer 120 may be formed of Al alloy or Cu alloy.

Then, a photoresist (not shown) is coated on the first conductive layer 120 and is then patterned to form a first interconnection pattern 172 and a plurality of bottom electrode patterns 171, which are spaced apart from one another by narrow gaps. The first interconnection pattern 172 and the bottom electrode patterns 171 can be formed at the different time or at the same time.

At this point, the bottom electrode patterns 171 are spaced apart from one another by narrow gaps, causing a pattern bridge. Therefore, unevenness is formed when the first conductive layer 120 is etched using the bottom electrode patterns 171 as an etching mask in the subsequent processes.

Figure 4:
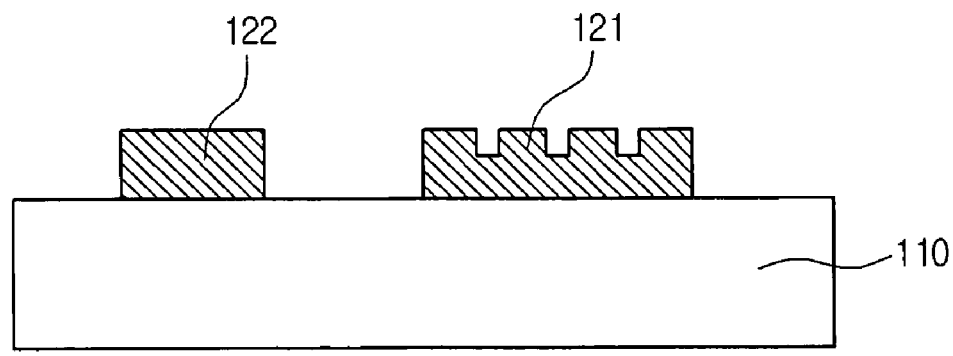

Referring to FIG. 4, a first interconnection 122 and a bottom electrode 121 with an uneven top surface are formed by etching the first conductive layer 120 using the first interconnection pattern 172 and the bottom electrode patterns 171 as the etching mask.

Specifically, the unevenness of the bottom electrode 121 increases the effective surface area of the capacitor, resulting in the increase of the electric capacity.

Also, a conductive plug (not shown) connecting to the bottom electrode 121 may be further formed below the bottom electrode 121 in the substrate 110. The conductive plug may be formed of tungsten, Al alloy, or Cu alloy.

Figure 5:
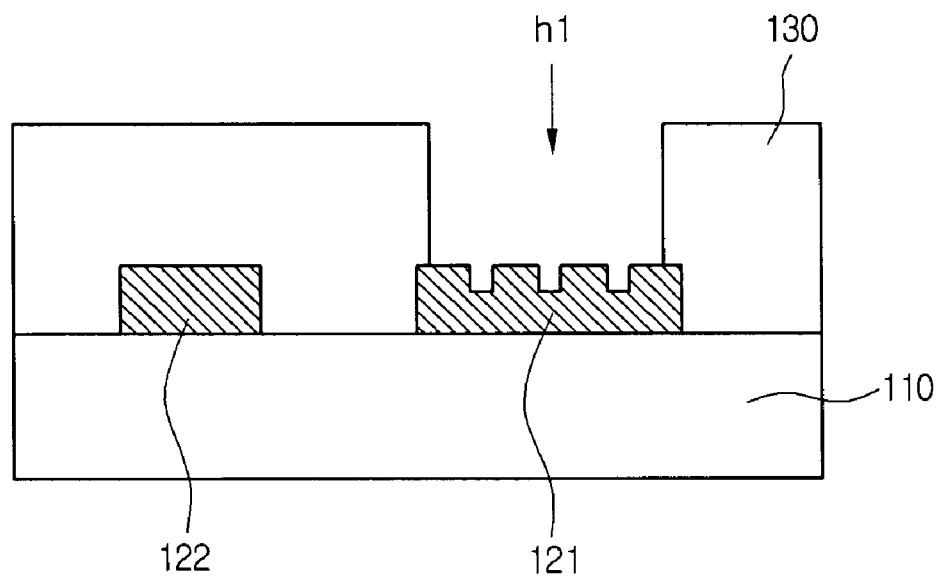

Referring to FIG. 5, an interlayer insulation layer 130 is formed on the substrate 110 including the first interconnection 122 and the bottom electrode 121. The interlayer insulation layer 130 may be formed of CVD-TEOS, PECVD-SiO$_2$, PECVD-SiON, or TEOS. Of course the interlayer insulation layer 130 may also be formed of other materials.

Then, a first via hole hi exposing a predetermined portion of the surface of the bottom electrode 121 is formed in the interlayer insulation layer 130 by selectively etching the interlayer insulation layer 130.

Figure 6:
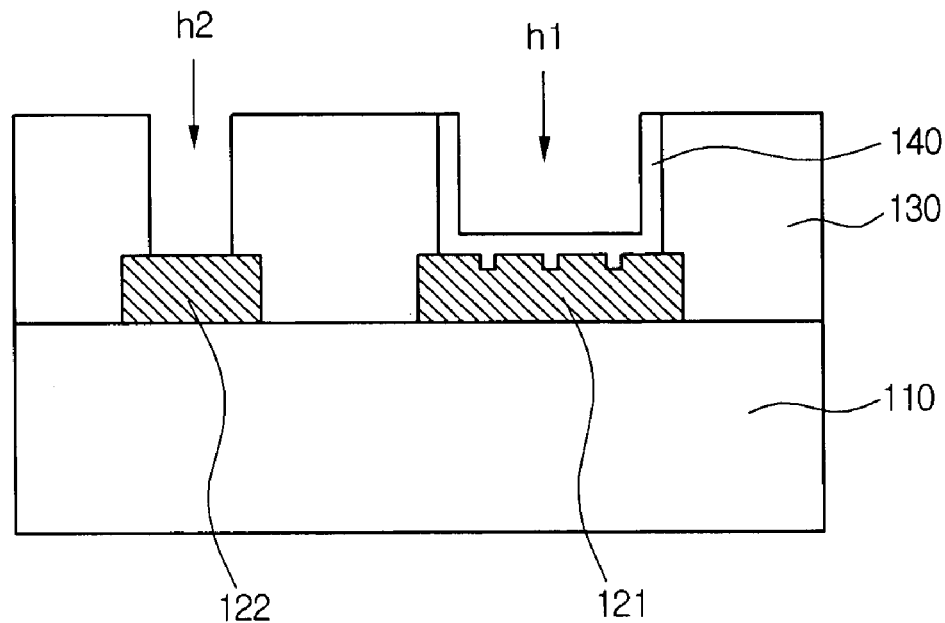

Referring to FIG. 6, a dielectric layer 140 is formed on the bottom electrode 121. The dielectric layer 140 may be formed on the top surface of the bottom electrode 121 and the interlayer insulation layer 130 inside the first via hole h1. The dielectric layer 140 may be formed in a single-layered structure or a multi-layered structure. That is, the dielectric layer 140 may be formed of material selected from the group consisting of P-TEOS, PEOX, PESiN, HDP, Ta$_2$O$_5$, SOG, O$_3$-TEOS, BST, PZT, and a combination thereof.

Also, the manufacturing method according to the first embodiment of the present invention can further include a planarization process. That is, after the dielectric layer 140 is formed, the planarization process is performed such that the dielectric layer 140 remains only at the inner side of the first via hole h1.

Then, a second via hole h2 exposing the top surface of the first interconnection 122 is formed in the interlayer insulation layer 130 by selectively etching the interlayer insulation layer 130.

Figure 7:
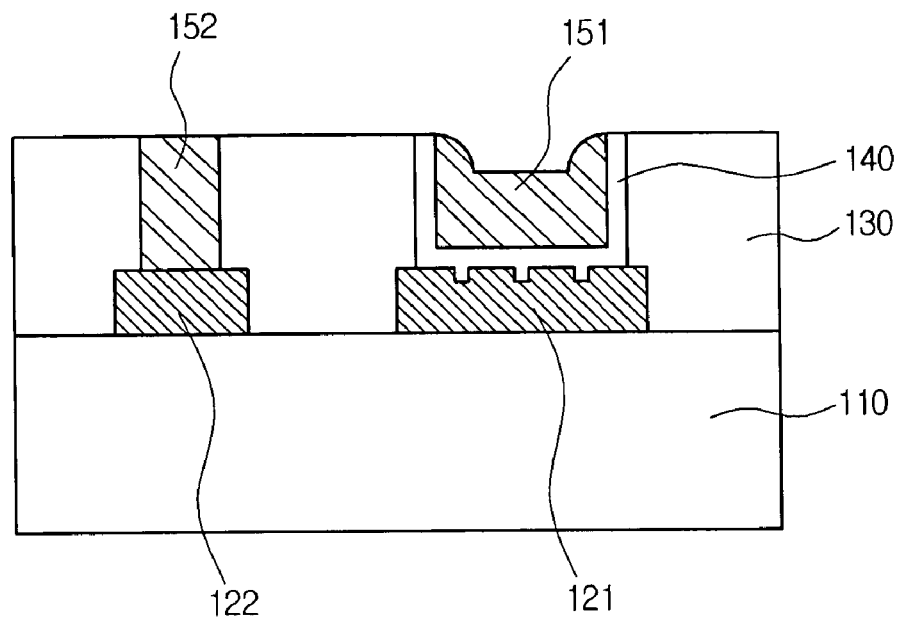

Referring to FIG. 7, the first via hole h1 and the second via hole h2 are filled to form a conductive plug 151 and a via plug 152. The conductive plug 151 and the via plug 152 may be formed of tungsten (W), Al alloy, or Cu alloy.

In this embodiment, when the conductive plug 151 is formed of tungsten, a barrier metal layer (not shown) may be further formed inside the first via hole hi. In this case, the barrier metal layer may be formed in a single-layered structure or a multi-layered structure. That is, the barrier metal layer may be formed of material selected from the group consisting of Ti, Ta, W, Mo, TiN, TiW, TaN, MoN, W—N, W—Si—N, Ta—Si—N, W—B—N, Ti—Si—N, a combination thereof.

Then, a second conductive layer (not shown) is formed on the interlayer insulation layer 130 where the conductive plug 151 and the via plug 152 are formed. The second conductive layer may be formed of Al alloy or Cu alloy.

Figure 8:
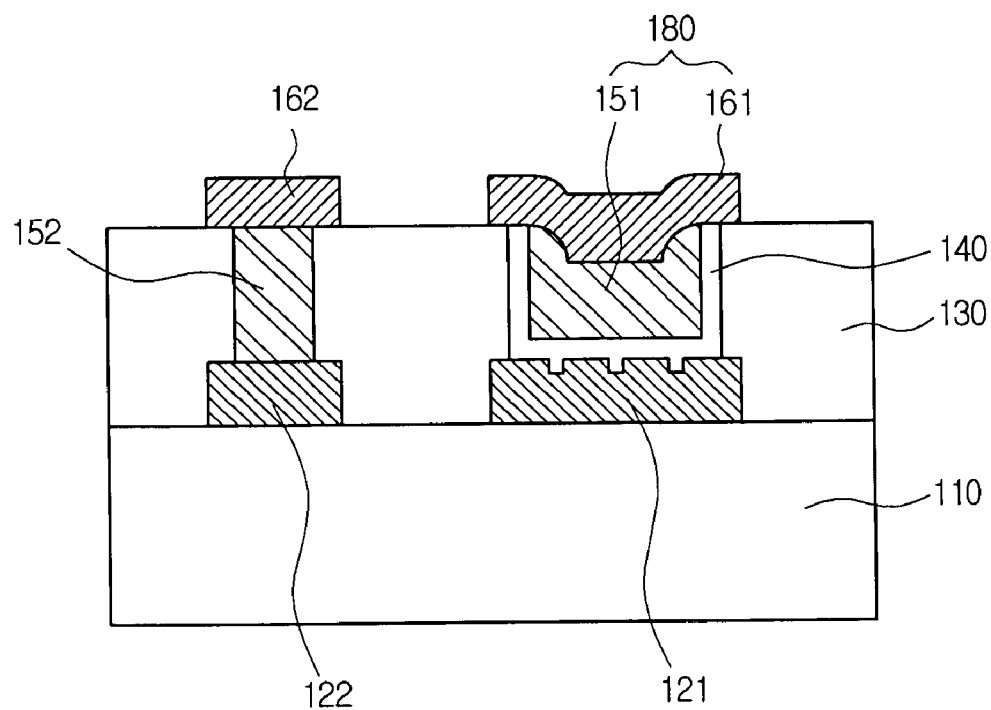

Referring to FIG. 8, the second conductive layer is selectively etched to form a second interconnection 162 connected to the via plug 152 and a conductive layer 161 connected to the conductive plug 151.

The conductive plug 151 and the conductive layer 161 serve as the top electrode 180.

Also, an anti-reflection layer (not shown) may be further formed on an entire surface of the resulting structure where the first conductive layer 120 is formed. In this case, when forming the first via hole h1, the interlayer insulation layer 130 may be etched such that the anti-reflection layer remains on the surface of the bottom electrode 121.

In addition, an anti-reflection layer (not shown) may be further formed on an entire surface of the resulting structure where the second conductive layer (not shown) is formed. In this case, when etching the second conductive layer, the anti-reflection layer can be etched together. The anti-reflection layer may be formed in a single-layered structure or a multi-layered structure. That is, the anti-reflection layer may be formed of Ti, Ta, W, Mo, TiN, TiW, TaN, MoN, W—N, W—Si—N, Ta—Si—N, W—B—N, Ti—Si—N, and a combination thereof.

Also, before forming the first conductive layer 120, a barrier metal layer (not shown) may be further formed on the substrate 110. At this point, when etching the first conductive layer 120, the barrier metal layer (not shown) can be etched together.

In addition, after forming the conductive plug 151, a barrier metal layer (not shown) may be further formed on the dielectric layer 140 including the conductive plug 151. At this point, when etching the second conductive layer, the barrier metal layer can be etched together.

Further, an RF etching process may be performed after the conductive plug 151 is formed and/or after the second via hole h2 is formed.

According to the first embodiment of the present invention, the effective surface area of the capacitor can be increased by forming the bottom electrode with the uneven top surface, resulting in the increase of the electric capacity.

In addition, since the capacitor has high electric capacity in the same size, the capacitor can be implemented in a small size, thereby attributing to high integration and ultra-miniaturization of the semiconductor device.

EMBODIMENT 2

A method of manufacturing a capacitor of a semiconductor device according to a second embodiment of the present invention includes forming a first conductive layer on a substrate, forming a first interconnection and a bottom electrode, forming an interlayer insulation layer, forming a first via hole, forming unevenness on the top surface of the bottom electrode, forming a dielectric layer, forming a conductive plug and a via plug, forming a second conductive layer, and forming a second interconnection and a conductive layer for a top electrode.

Unlike the first embodiment, after forming the first via hole, the unevenness is formed on the bottom electrode.

That is, in the operation of forming the unevenness on the top surface of the bottom electrode, a photoresist is coated on the bottom electrode and then a plurality of bottom electrode patterns are formed in narrow gaps.

Then, the bottom electrode is shallowly etched using the bottom electrode patterns as an etching mask, thereby forming the bottom electrode with an uneven top surface.

The manufacturing method of the second embodiment can employ the manufacturing method of the first embodiment.

According to the second embodiment of the present invention, by forming the bottom electrode with the uneven top surface, the dielectric layer is also formed unevenly. Consequently, the effective surface area of the capacitor increases and thus the electric capacity of the capacitor also increases.

Also, since the capacitor has high electric capacity in the same size, the capacitor can be implemented in a small size, thereby attributing to high integration and ultra-miniaturization of the semiconductor device.

It will be apparent to those skilled in the art that various modifications and variations can be made in the present invention. Thus, it is intended that the present invention covers the modifications and variations of this invention provided they come within the scope of the appended claims and their equivalent.

What is claimed is:

1. A capacitor of a semiconductor device, comprising:
   a bottom electrode formed on a substrate, the bottom electrode having an uneven top surface;
   an interlayer insulation layer formed on the substrate, the interlayer insulation layer having a via hole exposing the top surface of the bottom electrode;
   a dielectric layer formed unevenly on the bottom electrode; and
   a top electrode formed on the dielectric layer while filling the via hole, wherein the top electrode includes a conductive plug and a conductive layer that are formed in sequence.

2. The capacitor according to claim 1, wherein the dielectric layer is formed on the top surface of the bottom electrode and the interlayer insulation layer inside the via hole.

3. The capacitor according to claim 1, wherein the unevenness of the dielectric layer is formed at a lower portion thereof.

4. The capacitor according to claim 1, wherein the unevenness of the dielectric layer is formed at lower and upper portions thereof.

5. The capacitor according to claim 1, further comprising barrier metal layers formed in the bottom surface of the bottom electrode, the bottom surface of the conductive layer, and the bottom electrode of the conductive plug, respectively.

6. The capacitor according to claim 1, further comprising a conductive plug connected to the bottom electrode in the substrate disposed below the bottom electrode.

7. The capacitor according to claim 1, further comprising anti-reflection layers formed on the top surfaces of the bottom electrode and the top electrode, respectively.

8. A method of manufacturing a capacitor of a semiconductor device, comprising:
   forming a first conductive layer on a substrate;
   selectively etching the first conductive layer to form a first interconnection and a bottom electrode with an uneven top surface;
   forming an interlayer insulation layer on the substrate where the first interconnection and the bottom electrode are formed;
   selectively etching the interlayer insulation layer to form a first via hole exposing a surface of the bottom electrode, and forming a dielectric layer on the bottom electrode;
   selectively etching the interlayer insulation layer to form a second via hole exposing a top surface of the first interconnection, and forming a conductive plug and a via plug in the first via hole and the second via hole, respectively;
   forming a second conductive layer on the interlayer insulation layer wherein the conductive plug and the via plug are formed; and
   selectively etching the second conductive layer to form a second interconnection connecting to the via plug and a conductive layer connecting to the conductive plug.

9. The method according to claim 8, wherein the forming of the first interconnection and the bottom electrode with the uneven top surface includes:
   coating a photoresist on the first conductive layer and patterning the coated photoresist to form a first interconnection pattern and a plurality of bottom electrode patterns disposed in a narrow gap; and
   etching the first conductive layer using the first interconnection pattern and the bottom electrode patterns as an etching mask.

10. The method according to claim 8, wherein the dielectric layer is further formed on the top surface of the bottom electrode and the interlayer insulation layer disposed at an inner side of the first via hole.

11. The method according to claim 8, further comprising forming a conductive plug connected to the bottom electrode in the substrate below the bottom electrode.

12. The method according to claim 8, further comprising forming an anti-reflection layer on an entire surface of a resulting structure after the first conductive layer.

13. The method according to claim 8, further comprising forming an anti-reflection layer on an entire surface of a resulting structure after the second conductive layer is formed.

14. The method according to claim 8, further comprising forming a barrier metal layer on the substrate before the first conductive layer is formed.

15. The method according to claim 8, further comprising forming a barrier metal layer on the dielectric layer where the conductive plug is formed.

16. A method of manufacturing a capacitor of a semiconductor device, comprising:
   forming a first conductive layer on a substrate;
   patterning and etching the first conductive layer to form a first interconnection and a bottom electrode;
   forming an interlayer insulation layer on the substrate where the first interconnection and the bottom electrode are formed;
   etching the interlayer insulation layer to form a first via hole exposing a predetermined portion of a surface of the bottom electrode;
   forming unevenness on a top surface of the bottom electrode;
   forming a dielectric layer on the bottom electrode;
   selectively etching the interlayer insulation layer to form a second via hole exposing a top surface of the first interconnection, and forming a conductive plug and a via plug in the first via hole and the second via hole, respectively;
   forming a second conductive layer on the interlayer insulation layer where the conductive plug and the via plug are formed; and
   selectively etching the second conductive layer to form a second interconnection connecting to the via hole and a conductive layer connecting to the conductive plug.

17. The method according to claim 16, wherein the forming of the unevenness on the top surface of the bottom electrode includes:

coating a photoresist on the top surface of the bottom electrode and patterning the coated photoresist to form a plurality of bottom electrode patterns disposed in a narrow gap; and shallowly etching the top surface of the bottom electrode using the bottom electrode patterns as an etching mask.

18. The method according to claim 16, wherein the dielectric layer is further formed on the top surface of the bottom electrode and the interlayer insulation layer disposed at an inner side of the first via hole.

19. The method according to claim 16, further comprising forming a conductive plug connected to the bottom electrode in the substrate below the bottom electrode.

\* \* \* \* \*